United States Patent
Lee et al.

(10) Patent No.: US 9,226,401 B2
(45) Date of Patent: Dec. 29, 2015

(54) MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

(71) Applicant: SAMSUNG ELECTRO-MECHANICS CO., LTD., Suwon, Gyunggi-do (KR)

(72) Inventors: Hai Joon Lee, Gyunggi-do (KR); Doo Young Kim, Gyunggi-do (KR); Byoung Hwa Lee, Gyunggi-do (KR); Eun Hyuk Chae, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 165 days.

(21) Appl. No.: 14/137,600

(22) Filed: Dec. 20, 2013

(65) Prior Publication Data
US 2015/0060121 A1    Mar. 5, 2015

(30) Foreign Application Priority Data
Aug. 30, 2013    (KR) .................. 10-2013-0103713

(51) Int. Cl.
*H01G 4/30* (2006.01)
*H05K 1/18* (2006.01)
*H01G 4/12* (2006.01)
*H01G 4/008* (2006.01)

(52) U.S. Cl.
CPC ............... *H05K 1/185* (2013.01); *H01G 4/008* (2013.01); *H01G 4/12* (2013.01); *H01G 4/30* (2013.01); *H05K 2201/10015* (2013.01); *H05K 2201/10636* (2013.01)

(58) Field of Classification Search
CPC .......... H01G 4/005; H01G 4/01; H01G 4/012
USPC ....................................... 361/301.4
See application file for complete search history.

(56) References Cited

U.S. PATENT DOCUMENTS

2006/0139849 A1    6/2006    Yoon et al.
2010/0128411 A1    5/2010    Onishi et al.
2012/0194963 A1    8/2012    Kuroda et al.

FOREIGN PATENT DOCUMENTS

| JP | 2003-142830 A | 5/2003 |
| JP | 2003-347160 A | 12/2003 |
| JP | 2010-129737 A | 6/2010 |
| JP | 2012-156471 A | 8/2012 |
| KR | 10-2006-0073274 | 6/2006 |

OTHER PUBLICATIONS

Notice of Office Action Japanese Patent Application No. 2013-260427 dated Sep. 8, 2015 with English translation.

*Primary Examiner* — Dion R Ferguson
(74) *Attorney, Agent, or Firm* — McDermott Will & Emery LLP (57) ABSTRACT

There is provided a multilayer ceramic electronic part to be embedded in a board, including: a ceramic body including dielectric layers; first and second internal electrodes having first and second leads; and first and second external electrodes, wherein when lengths from edges of the first or second external electrode formed on first and second side surfaces of the ceramic body to points at which the first or second external electrode contacts the first and second leads are G1, lengths from the edges of the first or second external electrode formed on first and second side surfaces of the ceramic body to a corresponding end surface of the ceramic body are BW1, and lengths from the corresponding end surface of the ceramic body to points at which the first or second external electrode contacts the first and second leads are M1, 30 μm≤G1<BW1−M1 is satisfied.

18 Claims, 3 Drawing Sheets

MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

CROSS-REFERENCE TO RELATED APPLICATION

This application claims the benefit of Korean Patent Application No. 10-2013-0103713 filed on Aug. 30, 2013, with the Korean Intellectual Property Office, the disclosure of which is incorporated herein by reference.

BACKGROUND

The present disclosure relates to a multilayer ceramic electronic part to be embedded in a board and a printed circuit board having the multilayer ceramic electronic part embedded therein.

In accordance with high densification and high integration of an electronic circuit, a printed circuit board lacks a space for passive components to be mounted thereon. To solve this problem, an attempt to embed parts in the board, that is, to provide embedded devices, has been conducted. Particularly, various methods of embedding a multilayer ceramic electronic part used as a capacitive part in a board have been suggested.

As methods of providing a multilayer ceramic electronic part within a board, there is provided a method of using a board material itself as a dielectric material for a multilayer ceramic electronic part and using copper wiring, or the like as an electrode for a multilayer ceramic electronic part. Further, as other methods of implementing an embedded multilayer ceramic electronic part, there are provided a method of forming an embedded multilayer ceramic electronic part by forming a high-K polymer sheet or a dielectric thin film in a board, a method of embedding a multilayer ceramic electronic part in a board, and the like.

In general, a multilayer ceramic electronic part includes a plurality of dielectric layers formed of a ceramic material and internal electrodes inserted between the plurality of dielectric layers. Such a multilayer ceramic electronic part is disposed within a board, whereby an embedded multilayer ceramic electronic part having high capacitance may be implemented.

In order to manufacture a printed circuit board having a multilayer ceramic electronic part to be embedded therein, the multilayer ceramic electronic part is inserted into a core substrate and then via holes need to be formed in an upper plate and a lower plate using a laser to connect board wirings to external electrodes of the multilayer ceramic electronic part. Such laser processing is a factor in significantly increasing manufacturing costs of the printed circuit board.

Meanwhile, since the multilayer ceramic electronic part needs to be embedded in a core portion of the board, a nickel/tin (Ni/Sn) plating layer does not need to be formed on the external electrodes, unlike a general multilayer ceramic electronic part mounted on a surface of the board.

That is, since the external electrodes of the embedded multilayer ceramic electronic part are electrically connected to a circuit in the board through vias made of copper (Cu), a copper (Cu) layer, instead of the nickel/tin (Ni/Sn) layer, is required to be formed on the external electrodes.

Typically, since the external electrode is made of copper (Cu) as a main component but also includes glass, the glass component absorbs the laser during laser processing for forming the via in the board, and thus, it may be difficult to adjust a depth of the via.

For this reason, the copper (Cu) plating layer has been separately formed on the external electrodes of the embedded multilayer ceramic electronic part.

However, due to the separately formed copper (Cu) plating layer, manufacturing costs may be increased, and due to the permeation of a plating solution, a reliability problem may still occur. Therefore, the above problems still need to be solved.

Meanwhile, an embedded-type multilayer ceramic electronic part is embedded in a printed circuit board used in a memory card, a PC main board, and a variety of RF modules, whereby the size of a product may be significantly decreased as compared to a surface mounting-type multilayer ceramic electronic part.

In addition, since the embedded multilayer ceramic electronic part may be disposed to be very adjacent to an input terminal of an active component such as a microprocessor unit (MPU), interconnect inductance caused by the length of wiring may be decreased.

An effect of decreasing the inductance in the embedded multilayer ceramic electronic part to be in the board as mentioned above is merely considered to be the decrease in the interconnect inductance obtained by an unique arrangement known as an embedded method, and is still not sufficient to improve equivalent series inductance (ESL) characteristics of the embedded multilayer ceramic electronic part itself.

In general, a current path in the embedded multilayer ceramic electronic part needs to be short in order to decrease the ESL.

However, since the copper (Cu) plating layer is separately formed on the external electrodes of the embedded multilayer ceramic electronic part, the plating solution may be permeated into the external electrode, whereby it is difficult to shorten the current path in the embedded multilayer ceramic electronic part.

RELATED ART DOCUMENT (Patent Document 1) Korean Patent Laid-Open Publication No. 2006-0073274

SUMMARY

An aspect of the present disclosure may provide a multilayer ceramic electronic part to be embedded in a board and a printed circuit board having the multilayer ceramic electronic part embedded therein.

According to an aspect of the present disclosure, a multilayer ceramic electronic part to be embedded in a board may include: a ceramic body including dielectric layers and having first and second main surfaces opposing each other, first and second side surfaces opposing each other, and first and second end surfaces opposing each other; first and second internal electrodes stacked with each of the dielectric layers interposed therebetween and having first and second leads exposed to the first and second side surfaces of the ceramic body; and first and second external electrodes extending from the first and second end surfaces of the ceramic body to portions of the first and second main surfaces and the first and second side surfaces thereof, wherein when lengths from edges of the first or second external electrode formed on the first and second side surfaces of the ceramic body to points at which the first or second external electrode contacts the first and second leads are G1, lengths from the edges of the first or second external electrode formed on the first and second side surfaces of the ceramic body to a corresponding end surface of the ceramic body are BW1, and lengths from the corresponding end surface of the ceramic body to points at which the first or second external electrode contacts the first and second leads are M1, 30 µm≤G1<BW1−M1 is satisfied, the first internal electrodes are connected to the first external electrode by at least one first via extending to at least one of the first and second main surfaces of the ceramic body, and the second internal electrodes are connected to the second external electrode by at least one second via extending to at least one of the first and second main surfaces of the ceramic body.

The lengths M1 from the corresponding end surface of the ceramic body to the points at which the first or second external electrode contacts the first and second leads may satisfy 50 µm≤M1<BW1−G1.

When lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 30 µm≤G2<BW2−M2 may be satisfied.

When lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 50 µm≤M2<BW2−G2 may be satisfied.

The first and second external electrodes formed on the first and second side surfaces of the ceramic body may have an average thickness of 5 µm or more.

The first and second external electrodes may have a metal layer formed thereon, the metal layer being formed of copper (Cu).

According to another aspect of the present disclosure, a multilayer ceramic electronic part to be embedded in a board may include: a ceramic body including dielectric layers and having first and second main surfaces opposing each other, first and second side surfaces opposing each other, and first and second end surfaces opposing each other; first and second internal electrodes stacked with each of the dielectric layers interposed therebetween and having first and second leads exposed to at least one of the first and second side surfaces of the ceramic body; and first and second external electrodes extending from the first and second end surfaces of the ceramic body to portions of the first and second main surfaces and the first and second side surfaces thereof, wherein when lengths from edges of the first or second external electrode formed on the first and second side surfaces of the ceramic body to points at which the first or second external electrode contacts the first and second leads are G1, lengths from the edges of the first or second external electrode formed on the first and second side surfaces of the ceramic body to a corresponding end surface of the ceramic body are BW1, and lengths from the corresponding end surface of the ceramic body to points at which the first or second external electrode contacts the first and second leads are M1, 50 µm≤M1<BW1−G1 is satisfied, the first internal electrodes are connected to the first external electrode by at least one first via extending to at least one of the first and second main surfaces of the ceramic body, and the second internal electrodes are connected to the second external electrode by at least one second via extending to at least one of the first and second main surfaces of the ceramic body.

When lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 30 µm≤G2<BW2−M2 may be satisfied.

When lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 50 µm≤M2<BW2−G2 may be satisfied.

The first and second external electrodes formed on the first and second side surfaces of the ceramic body may have an average thickness of 5 µm or more.

The first and second external electrodes may have a metal layer formed thereon, the metal layer being formed of copper (Cu).

According to another aspect of the present disclosure, a printed circuit board having a multilayer ceramic electronic part embedded therein may include: an insulating substrate; and the multilayer ceramic electronic part as described above embedded in the insulating substrate.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 1:
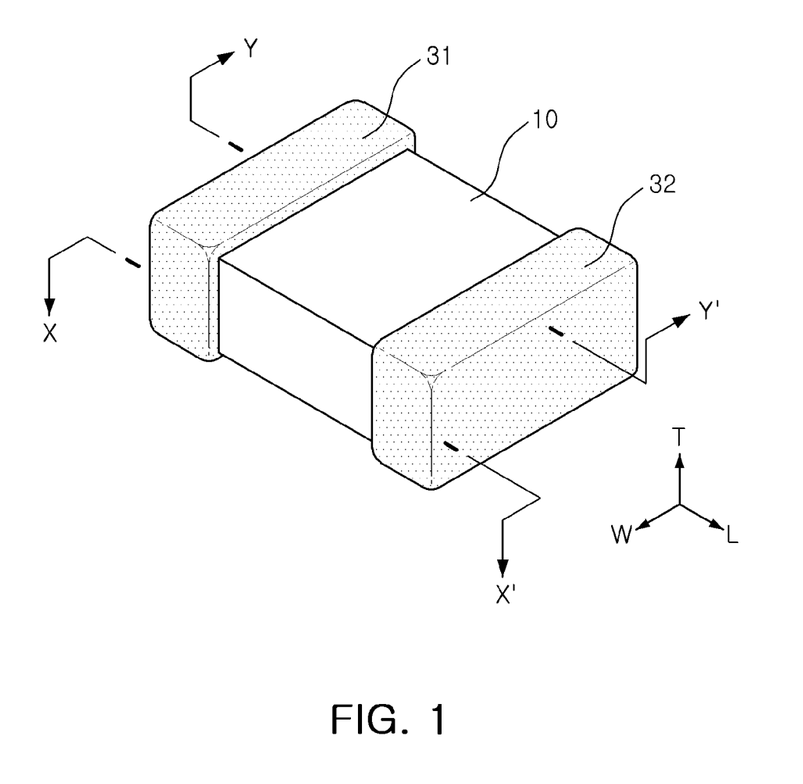
FIG. 1 is a perspective view illustrating a multilayer ceramic electronic part to be embedded in a board according to an exemplary embodiment of the present disclosure.

FIG. 1 is a perspective view illustrating a multilayer ceramic electronic part to be embedded in a board according to an exemplary embodiment of the present disclosure.

Figure 2:
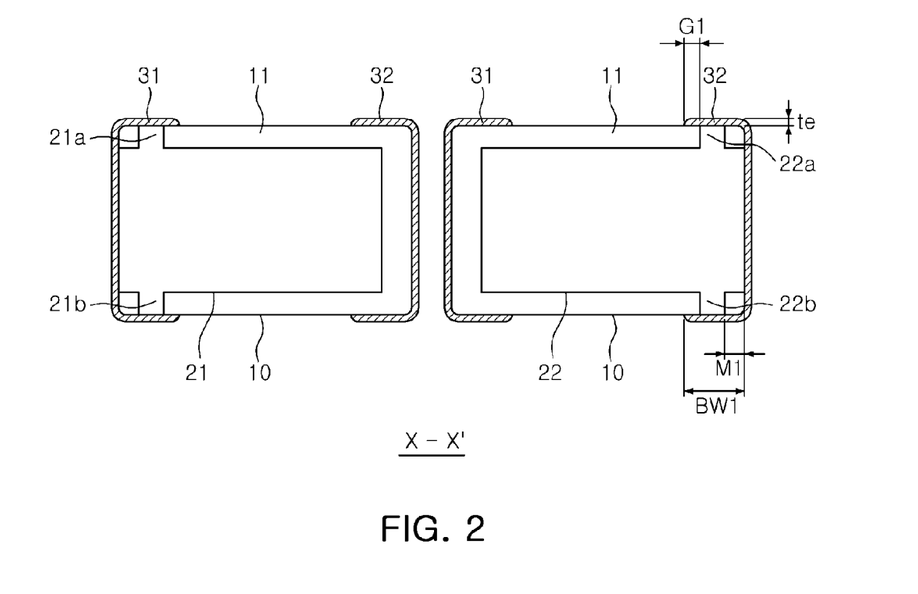
FIG. 2 is a cross-sectional view taken along line X-X' of FIG. 1.

FIG. 2 is a cross-sectional view taken along line X-X' of FIG. 1.

Figure 3:
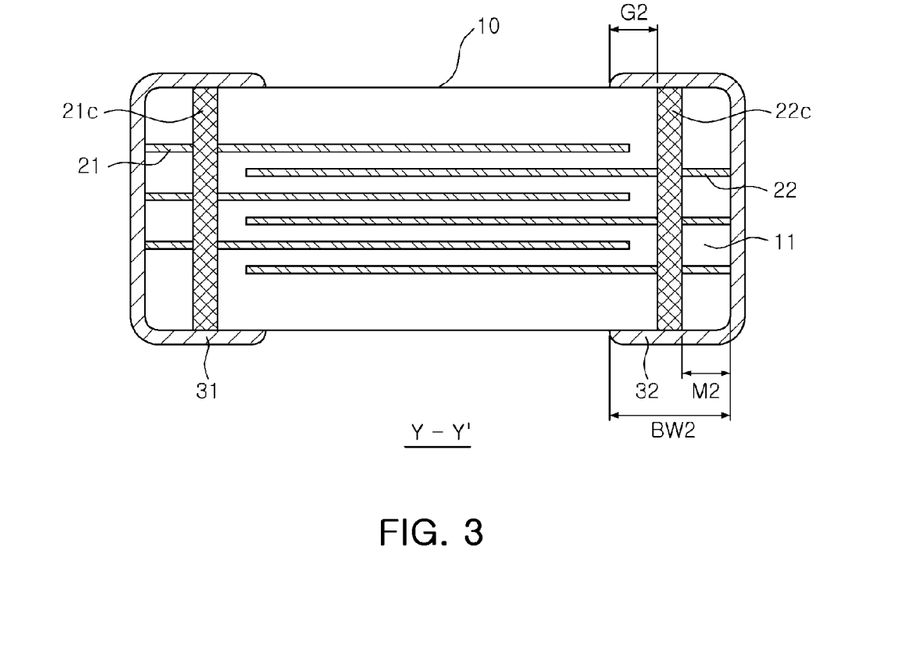
FIG. 3 is a cross-sectional view taken along line Y-Y' of FIG. 1.

FIG. 3 is a cross-sectional view taken along line Y-Y' of FIG. 1.

Referring to FIGS. 1 and 2, a multilayer ceramic electronic part to be embedded in a board according to an exemplary embodiment of the present disclosure may include a ceramic body 10 including dielectric layers 11 and having first and second main surfaces opposing each other, first and second side surfaces opposing each other, and first and second end surfaces opposing each other; first and second internal electrodes 21 and 22 stacked with each of the dielectric layers 11 interposed therebetween and having first and second leads 21a, 21b, 22a, and 22b exposed to the first and second side surfaces of the ceramic body 10; and first and second external electrodes 31 and 32 extending from the first and second end surfaces of the ceramic body 10 to portions of the first and second main surfaces and the first and second side surfaces thereof.

Hereinafter, the multilayer ceramic electronic part according to the embodiment of the present disclosure will be described by taking a multilayer ceramic capacitor by way of example. However, the present inventive concept is not limited thereto.

In the multilayer ceramic capacitor according to the present embodiment, a "length direction" is referred to as an "L" direction of FIG. 1, a "width direction" is referred to as a "W" direction of FIG. 1, and a "thickness direction" is referred to as a "T" direction of FIG. 1. Here, the "thickness direction" is the same as a direction in which dielectric layers are stacked, that is, a "stacking direction."

In the embodiment of the present disclosure, a shape of the ceramic body 10 is not particularly limited, but may be hexahedral as illustrated.

According to the embodiment of the present disclosure, the ceramic body 10 may have the first and second main surfaces opposing each other, the first and second side surfaces opposing each other, and the first and second end surfaces opposing each other, and the first and second main surfaces may be upper and lower surfaces of the ceramic body 10, respectively.

According to the exemplary embodiment of the present disclosure, a raw material forming the dielectric layers 11 is not particularly limited as long as sufficient capacitance may be obtained, but may be a barium titanate ($BaTiO_3$) powder, for example.

As a material forming the dielectric layers 11, various ceramic additives, organic solvents, plasticizers, binders, dispersing agents, and the like may be added to a powder such as a barium titanate ($BaTiO_3$) powder, or the like.

An average particle diameter of a ceramic powder used for forming the dielectric layers 11 is not particularly limited, and may be adjusted to satisfy desired dielectric properties. For example, the average particle diameter of the ceramic powder may be adjusted to 400 nm or less.

A material forming the first and second internal electrodes 21 and 22 is not particularly limited, but may be a conductive paste formed of, for example, precious metals such as palladium (Pd), a palladium-silver (Pd—Ag) alloy, and the like, and at least one of nickel (Ni) and copper (Cu).

The first and second internal electrodes 21 and 22 may be stacked with each of the dielectric layers 11 interposed therebetween. The first internal electrode 21 may have the first and second leads 21a and 21b exposed to the first and second side surfaces of the ceramic body 10, respectively. In addition, the second internal electrode 22 may have the first and second leads 22a and 22b exposed to the first and second side surfaces of the ceramic body 10, respectively.

In addition, the first and second internal electrodes 21 and 22 may be electrically connected to the first and second external electrodes 31 and 32 through the first and second leads 21a, 21b, 22a, and 22b exposed to the first and second side surfaces of the ceramic body 10.

Unlike a general multilayer ceramic capacitor in which internal electrodes are connected to external electrodes through both end surfaces of the ceramic body, the internal electrodes in the present embodiment are extended and exposed to the side surfaces of the ceramic body and a current path is shortened, whereby equivalent series inductance (ESL) may be decreased.

According to the present embodiment, the first and second external electrodes 31 and 32 may be formed to extend from the first and second end surfaces of the ceramic body 10 to portions of the first and second main surfaces and the first and second side surfaces thereof.

The first and second external electrodes 31 and 32 may be formed of a material including a conductive metal and glass.

In order to form capacitance, the first and second external electrodes 31 and 32 may be formed to extend from the first and second end surfaces of the ceramic body 10 to the portions of the first and second main surfaces and the first and second side surfaces thereof, and may be electrically connected to the first and second internal electrodes 21 and 22 by the first and second leads 21a, 21b, 22a, and 22b exposed to the first and second side surfaces of the ceramic body 10.

The first and second external electrodes 31 and 32 may be formed of a conductive material having the same material as the first and second internal electrodes 21 and 22, but are not limited thereto, and may be formed of at least one conductive metal selected from a group consisting of copper (Cu), silver (Ag), nickel (Ni), and alloys thereof, for example.

The first and second external electrodes 31 and 32 may be formed by applying and sintering a conductive paste prepared by adding glass frit to the conductive metal powder.

According to the embodiment of the present disclosure, the first and second external electrodes 31 and 32 may have a metal layer formed thereon, the metal layer being formed of copper (Cu).

In general, since a multilayer ceramic capacitor is mounted on a printed circuit board, a nickel and tin plating layer may be formed on external electrodes.

However, the multilayer ceramic capacitor according to the embodiment of the present disclosure is not mounted on the printed circuit board, but is embedded in the board, and thus, a circuit of the board may be electrically connected to the first and second external electrodes 31 and 32 through vias formed of copper (Cu).

Therefore, according to the embodiment of the present disclosure, a metal layer formed of copper (Cu) having excellent electrical connectivity with copper (Cu) forming the vias in the board may be further formed on the first and second external electrodes 31 and 32.

Meanwhile, since the first and second external electrodes 31 and 32 are formed of copper (Cu) as a main component but also include glass, the glass component absorbs laser during laser processing for forming the vias in the board, and thus, it may be difficult to adjust depths of the vias.

This problem may be solved by forming the metal layer formed of copper (Cu) on the first and second external electrodes 31 and 32.

A method of forming the metal layer formed of copper (Cu) is not particularly limited. For example, the metal layer may be formed by a plating method.

As another method, the metal layer may be formed by applying a conductive paste including copper (Cu) with the exclusion of glass frit to the first and second external electrodes 31 and 32.

In the case in which the metal layer is formed by the application of the conductive paste, the metal layer may be only formed of copper (Cu) after sintering.

Referring to FIG. 2, in the multilayer ceramic electronic part according to the embodiment of the present disclosure, when lengths from edges of the first or second external electrode 31 or 32 formed on the first and second side surfaces of the ceramic body 10 to points at which the first or second external electrode 31 or 32 contacts the first and second leads 21a, 21b, 22a, and 22b are G1, lengths from the edges of the first or second external electrode 31 or 32 formed on the first and second side surfaces of the ceramic body 10 to a corresponding end surface of the ceramic body 10 are BW1, and lengths from the corresponding end surface of the ceramic body 10 to points at which the first or second external electrode 31 or 32 contacts the first and second leads are M1, 30 $\mu m \leq G1 < BW1-M1$ may be satisfied.

When the lengths G1 from the edges of the first or second external electrode 31 or 32 formed on the first and second side surfaces of the ceramic body to the points at which the first or second external electrode 31 or 32 contacts the first and second leads 21a, 21b, 22a, and 22b are adjusted to satisfy 30 $\mu m \leq G1 < BW1-M1$, a decrease in reliability caused by permeation of a plating solution may be prevented.

In the case in which the lengths G1 from the edges of the first or second external electrode 31 or 32 formed on the first and second side surfaces of the ceramic body to the points at which the first or second external electrode 31 or 32 contacts the first and second leads 21a, 21b, 22a, and 22b are below 30 $\mu m$, reliability may be decreased by the permeation of the plating solution.

In the case in which the lengths G1 from the edges of the first or second external electrode 31 or 32 formed on the first and second side surfaces of the ceramic body to the points at which the first or second external electrode 31 or 32 contacts the first and second leads 21a, 21b, 22a, and 22b are equal to a value subtracting the lengths M1 from the corresponding end surface of the ceramic body 10 to the points at which the first or second external electrode 31 or 32 contacts the first and second leads from the lengths BW1 from the edges of the first or second external electrode 31 or 32 formed on the first and second side surfaces of the ceramic body 10 to the corresponding end surface of the ceramic body 10, the leads cannot be formed, whereby the internal electrodes and the external electrodes cannot be connected through the side surfaces of the ceramic body 10.

In a multilayer ceramic electronic part according to another exemplary embodiment of the present disclosure, the lengths M1 from the corresponding end surface of the ceramic body 10 to the points at which the first or second external electrode 31 or 32 contacts the first and second leads 21a, 21b, 22a, and 22b may satisfy 50 $\mu m \leq M1 < BW1-G1$, in addition to the above-described characteristics according to the previous embodiment of the present disclosure.

By adjusting the lengths M1 from the corresponding end surface of the ceramic body 10 to the points at which the first or second external electrode 31 or 32 contacts the first and second leads 21a, 21b, 22a, and 22b to satisfy 50 $\mu m \leq M1 < BW1-G1$, delamination may be prevented, whereby the multilayer ceramic electronic part may have excellent reliability.

In the case in which the lengths M1 from the corresponding end surface of the ceramic body 10 to the points at which the first or second external electrode 31 or 32 contacts the first and second leads 21a, 21b, 22a, and 22b are below 50 $\mu m$, the delamination may occur, whereby reliability may be decreased.

In the case in which the lengths M1 from the corresponding end surface of the ceramic body 10 to the points at which the first or second external electrode 31 or 32 contacts the first and second leads 21a, 21b, 22a, and 22b are equal to BW1-G1, the leads cannot be formed, whereby the internal electrodes and the external electrodes cannot be connected through the side surfaces of the ceramic body 10.

Meanwhile, according to the embodiment of the present disclosure, the first and second external electrodes 31 and 32 formed on the first and second side surfaces of the ceramic body 10 may have an average thickness te of 5 $\mu m$ or more.

By adjusting the average thickness te of the first and second external electrodes 31 and 32 formed on the first and second side surfaces of the ceramic body 10 to be 5 $\mu m$ or more, the decrease in reliability caused by the permeation of the plating solution may be prevented.

In the case in which the average thickness te of the first and second external electrodes 31 and 32 formed on the first and second side surfaces of the ceramic body 10 is below 5 $\mu m$, reliability may be decreased by the permeation of the plating solution.

The average thickness te of the first and second external electrodes 31 and 32 formed on the first and second side surfaces of the ceramic body 10, the lengths G1 from the edges of the first or second external electrode 31 or 32 formed on the first and second side surfaces of the ceramic body to the points at which the first or second external electrode 31 or 32 contacts the first and second leads 21a, 21b, 22a, and 22b, the lengths BW1 from the edges of the first or second external electrode 31 or 32 formed on the first and second side surfaces of the ceramic body 10 to the corresponding end surface of the ceramic body 10, and the lengths M1 from the corresponding end surface of the ceramic body 10 to the points at which the first or second external electrode 31 or 32 contacts the first and second leads 21a, 21b, 22a, and 22b may be measured on an image captured by scanning a cross-section of the ceramic body 10 in a length-width direction using a scanning electron microscope (SEM) as shown in FIG. 2.

For example, as shown in FIG. 2, the lengths and the thickness of corresponding portions of the first or second external electrode 31 or 32 may be measured from the image captured by scanning the cross-section of the ceramic body 10 taken in the length-width (L-W) direction after cutting in a central portion of the ceramic body 10 in the thickness direction thereof using the scanning electron microscope (SEM).

FIG. 3 is a cross-sectional view taken along line Y-Y' of FIG. 1.

Referring to FIG. 3, the first internal electrodes 21 may be connected to the first external electrode 31 by at least one first via 21c extending to at least one of the first and second main surfaces of the ceramic body 10, and the second internal electrodes 22 may be connected to the second external electrode 32 by at least one second via 22c extending to at least one of the first and second main surfaces of the ceramic body 10.

In general, a multilayer ceramic electronic part to be embedded in the board has a copper (Cu) plating layer separately formed on external electrodes, internal electrodes may be affected by the permeation of a plating solution.

For this reason, the embedded multilayer ceramic electronic part has thick upper and lower cover layers to prevent damages to the internal electrodes due to the plating solution permeation.

However, in the case in which the upper and lower cover layers are thick as described above, a current path in the multilayer ceramic electronic part to be embedded in the board may be increased, whereby it may be difficult to decrease equivalent series inductance (ESL).

Therefore, according to the embodiment of the present disclosure, the first internal electrodes 21 are connected to the first external electrode 31 by at least one first via 21c extending to at least one of the first and second main surfaces of the ceramic body 10 and the second internal electrodes 22 are connected to the second external electrode 32 by at least one second via 22c extending to at least one of the first and second main surfaces of the ceramic body 10, whereby the equivalent series inductance (ESL) may be decreased.

Specifically, the equivalent series inductance (ESL) may be decreased by shortening the current path in the multilayer ceramic electronic part to be embedded in the board.

In a case of a general multilayer ceramic electronic part to be embedded in a board, current flows to first internal electrodes through a first end surface of a ceramic body by voltage applied to a first external electrode and a current path is formed between second internal electrodes and a second external electrode through a second end surface of the ceramic body.

However, in the case in which the first internal electrodes 21 are connected to the first external electrode 31 by at least one first via 21c extending to at least one of the first and second main surfaces of the ceramic body 10 and the second internal electrodes 22 are connected to the second external electrode 32 by at least one second via 22c extending to at least one of the first and second main surfaces of the ceramic body 10 as in the embodiment of the present disclosure, the current path may be shortened.

That is, in the case in which the current flows through the first or second main surface of the ceramic body according to the embodiment of the present disclosure as compared to the case in which the current flows through both end surfaces of the ceramic body, the current path may be shortened.

The current path is shortened as described above, such that the equivalent series inductance (ESL) of the multilayer ceramic electronic part to be embedded in the board may be decreased.

FIG. 3 illustrates a single first via 21c and a single second via 22c; however, the present inventive concept is not limited thereto, and the number and shape of vias may be variously changed.

Meanwhile, when lengths from edges of the first or second external electrode 31 or 32 formed on the first and second main surfaces of the ceramic body 10 to points at which the first or second external electrode 31 or 32 contacts the first and second vias 21c and 22c are G2, lengths from the edges of the first or second external electrode 31 or 32 formed on the first and second main surfaces of the ceramic body 10 to a corresponding end surface of the ceramic body 10 are BW2, and lengths from the corresponding end surface of the ceramic body 10 to points at which the first or second external electrode 31 or 32 contacts the first and second vias 21c and 22c are M2, 30 $\mu m \leq G2 < BW2-M2$ may be satisfied.

When the lengths G2 from the edges of the first or second external electrode 31 or 32 formed on the first and second main surfaces of the ceramic body 10 to the points at which the first or second external electrode 31 or 32 contacts the first and second vias 21c and 22c are adjusted to satisfy 30 $\mu m \leq G2 < BW2-M2$, a decrease in reliability caused by permeation of a plating solution may be prevented.

In the case in which the lengths G2 from the edges of the first or second external electrode 31 or 32 formed on the first and second main surfaces of the ceramic body 10 to the points at which the first or second external electrode 31 or 32 contacts the first and second vias 21c and 22c are below 30 μm, reliability may be decreased by the permeation of the plating solution.

In the case in which the lengths G2 from the edges of the first or second external electrode 31 or 32 formed on the first and second main surfaces of the ceramic body 10 to the points at which the first or second external electrode 31 or 32 contacts the first and second vias 21c and 22c are equal to a value subtracting the lengths M2 from the corresponding end surface of the ceramic body 10 to the points at which the first or second external electrode 31 or 32 contacts the first and second vias 21c and 22c from the lengths BW2 from the edges of the first or second external electrode 31 or 32 formed on the first and second main surfaces of the ceramic body 10 to the corresponding end surface of the ceramic body 10, the leads cannot be formed, whereby the internal electrodes and the external electrodes cannot be connected through the upper and lower surfaces of the ceramic body 10.

In a multilayer ceramic electronic part according to another exemplary embodiment of the present disclosure, the lengths M2 from the corresponding end surface of the ceramic body 10 to the points at which the first or second external electrode 31 or 32 contacts the first and second vias 21c and 22c may satisfy 50 $\mu m \leq M2 < BW2-G2$.

By adjusting the lengths M2 from the corresponding end surface of the ceramic body 10 to the points at which the first or second external electrode 31 or 32 contacts the first and second vias 21c and 22c to satisfy 50 $\mu m \leq M2 < BW2-G2$, delamination may be prevented, whereby the multilayer ceramic electronic part may have excellent reliability.

In the case in which the lengths M2 from the corresponding end surface of the ceramic body 10 to the points at which the first or second external electrode 31 or 32 contacts the first and second vias 21c and 22c are below 50 μm, the delamination may occur, whereby reliability may be decreased.

In the case in which the lengths M2 from the corresponding end surface of the ceramic body 10 to the points at which the first or second external electrode 31 or 32 contacts the first and second vias 21c and 22c are equal to BW2-G2, the vias cannot be formed, such that the internal electrodes and the external electrodes cannot be connected through the upper and lower surfaces of the ceramic body 10.

According to another exemplary embodiment of the present disclosure, a multilayer ceramic electronic part to be embedded in a board may include a ceramic body 10 including dielectric layers 11 and having first and second main surfaces opposing each other, first and second side surfaces opposing each other, and first and second end surfaces opposing each other; first and second internal electrodes stacked with each of the dielectric layers interposed therebetween while being spaced apart from the first and second end surfaces of the ceramic body 10 and having first and second leads 21a, 21b, 22a, and 22b exposed to at least one of the first and second side surfaces of the ceramic body 10; and first and second external electrodes 31 and 32 extending from the first and second end surfaces of the ceramic body 10 to portions of the first and second main surfaces and the first and second side surfaces thereof, wherein when lengths from edges of the first or second external electrode 31 or 32 formed on the first and second side surfaces of the ceramic body 10 to points at which the first or second external electrode 31 or 32 contacts the first and second leads 21a, 21b, 22a, and 22b are G1, lengths from the edges of the first or second external electrode 31 or 32 formed on the first and second side surfaces of the ceramic body 10 to a corresponding end surface of the ceramic body 10 are BW1, and lengths from the corresponding end surface of the ceramic body 10 to points at which the first or second external electrode 31 or 32 contacts the first and second leads 21a, 21b, 22a, and 22b are M1, 50 $\mu m \leq M1 < BW1-G1$ is satisfied.

When lengths from edges of the first or second external electrode 31 or 32 formed on the first and second main surfaces of the ceramic body 10 to points at which the first or second external electrode 31 or 32 contacts the first and second vias 21c and 22c are G2, lengths from the edges of the first or second external electrode 31 or 32 formed on the first and second main surfaces of the ceramic body 10 to a corresponding end surface of the ceramic body 10 are BW2, and lengths from the corresponding end surface of the ceramic body 10 to points at which the first or second external electrode 31 or 32 contacts the first and second vias 21c and 22c are M2, 30 $\mu m \leq G2 < BW2-M2$ may be satisfied.

In addition to the above-described characteristics according to another exemplary embodiment of the present disclosure, the lengths M2 from the corresponding end surface of the ceramic body 10 to the points at which the first or second external electrode 31 or 32 contacts the first and second vias 21c and 22c may satisfy 50 $\mu m$ M2<BW2-G2.

The first and second external electrodes formed on the first and second side surfaces of the ceramic body may have an average thickness of 5 $\mu m$ or more.

The first and second external electrodes may have a metal layer formed thereon, the metal layer being formed of copper (Cu).

Details of the multilayer ceramic capacitor according to the present embodiment are the same as those of the multilayer ceramic capacitor according to the above-described embodiment. Therefore, a description thereof will be omitted.

In a method of manufacturing a multilayer ceramic electronic part to be embedded in a board according to an exemplary embodiment of the present disclosure, a plurality of ceramic green sheets may first be prepared by applying a slurry including a powder such as a barium titanate ($BaTiO_3$) powder or the like to carrier films and drying the same, thereby forming dielectric layers.

The slurry may be prepared by mixing a ceramic powder, a binder, and a solvent, and the slurry may be used to form the ceramic green sheets having a thickness of several $\mu m$ by a doctor blade method.

Next, a conductive paste for internal electrodes may be prepared to include 40 to 50 parts by weight of a nickel powder having a nickel particle average size of 0.1 to 0.2 $\mu m$.

The conductive paste for internal electrodes may be applied to the green sheets by a screen printing method to thereby form internal electrodes, and then the green sheets having the internal electrodes formed thereon may be stacked in an amount of 200 to 300 layers, whereby a ceramic body may be manufactured.

Next, first and second external electrodes including a conductive metal and glass may be formed on upper and lower surfaces and end portions of the ceramic body.

The conductive metal is not particularly limited, but may be at least one selected from a group consisting of copper (Cu), silver (Ag), nickel (Ni), and alloys thereof, for example.

The glass is not particularly limited, but a material having the same composition as that of glass used for manufacturing external electrodes of a general multilayer ceramic capacitor may be used.

The first and second external electrodes may be formed on the upper and lower surfaces of the ceramic body and the end portions of the ceramic body so as to be electrically connected to the first and second internal electrodes, respectively.

Then, a metal layer formed of copper (Cu) may be formed on the first and second external electrodes.

A description of the same features as those of the multilayer ceramic electronic part to be embedded in the board according to above-described embodiment of the present disclosure will be omitted herein.

Figure 4:
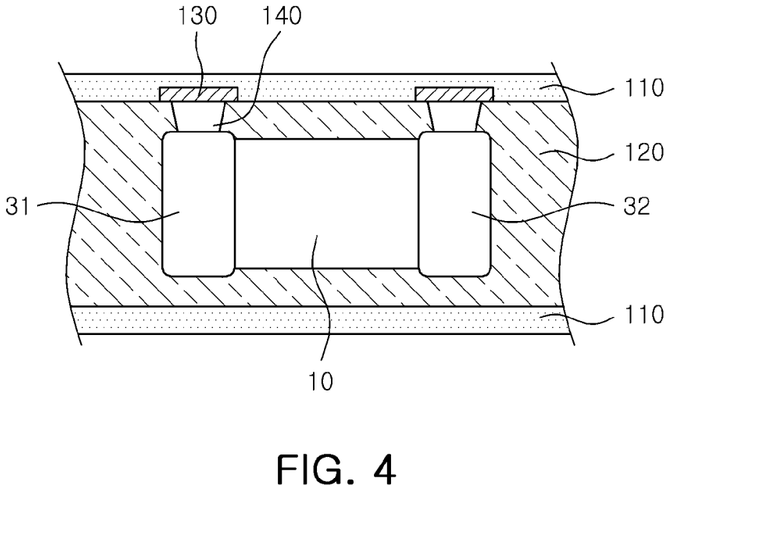
FIG. 4 is a cross-sectional view illustrating a printed circuit board having a multilayer ceramic electronic part embedded therein according to another exemplary embodiment of the present disclosure.

FIG. 4 is a cross-sectional view illustrating a printed circuit board having a multilayer ceramic electronic part embedded therein according to another exemplary embodiment of the present disclosure.

Referring to FIG. 4, a printed circuit board 100 having a multilayer ceramic electronic part embedded therein according to another embodiment of the present disclosure may include an insulating substrate 110, and the embedded multilayer ceramic electronic part according to the above-described embodiment of the present disclosure.

The insulating substrate 110 may have a structure including an insulating layer 120, and may include a conductive pattern 130 and a conductive via hole 140 configuring an interlayer circuit having various forms as shown in FIG. 4, as necessary. The insulating substrate 110 may be the printed circuit board 100 including the multilayer ceramic electronic part embedded therein.

After the multilayer ceramic electronic part is inserted into the printed circuit board 100, it equally experiences several severe environments during post-processing such as a heat treatment, or the like, of the printed circuit board 100.

Particularly, contraction and expansion of the printed circuit board 100 in the heat treatment are directly delivered to the multilayer ceramic electronic part inserted into the printed circuit board 100 to thereby apply stress to an adhesion surface between the multilayer ceramic electronic part and the printed circuit board 100.

In the case in which the stress applied to the adhesion surface between the multilayer ceramic electronic part and the printed circuit board 100 is greater than adhesion strength, peeling defects in which the adhesion surface is peeled may occur.

Since the adhesion strength between the multilayer ceramic electronic part and the printed circuit board 100 is proportional to electrochemical adhesion and an effective surface area of the adhesion surface between the multilayer ceramic electronic part and the printed circuit board 100, surface roughness of the multilayer ceramic electronic part may be controlled to improve the effective surface area, whereby the peeling phenomenon between the multilayer ceramic electronic part and the printed circuit board 100 may be alleviated.

Hereinafter, the present inventive concept will be described in detail with reference to inventive and comparative examples, but is not limited thereto.

Inventive Example

According to the inventive example, a multilayer ceramic electronic part to be embedded in a board was manufactured to satisfy the above numerical values with regard to an average thickness te of first and second external electrodes formed on first and second side surfaces of a ceramic body, lengths G1 from edges of the first or second external electrode formed on the first and second side surfaces of the ceramic body to points at which the first or second external electrode contacts first and second leads, and lengths M1 from a corresponding end surface of the ceramic body to points at which the first or second external electrode contacts the first and second leads.

Comparative Example

According to the comparative example, a multilayer ceramic electronic part to be embedded in a board was manufactured under the same conditions as those of the inventive example, except that numerical values with regard to an average thickness te of first and second external electrodes formed on first and second side surfaces of a ceramic body, lengths G1 from edges of the first or second external electrode formed on the first and second side surfaces of the ceramic body to points at which the first or second external electrode contacts first and second leads, and lengths M1 from a corresponding end surface of the ceramic body to points at which the first or second external electrode contacts the first and second leads were out of the numerical value range of the inventive example.

The following Table 1 shows reliability comparison results based on the values with regard to the average thickness te of the first and second external electrodes formed on the first and second side surfaces of the ceramic body and the lengths G1 from the edges of the first or second external electrode formed on the first and second side surfaces of the ceramic body to the points at which the first or second external electrode contacts the first and second leads.

The reliability evaluation was determined based on whether or not an accelerated life was decreased by the permeation of the plating solution. Tests were performed by applying rated voltage to samples for 1 hour under condition 8585 (85° C. and humidity of 85%). A case having a defect rate less than 0.01% is indicated as ⊚, a case having a defect rate of 0.01% to 1.00% is indicated as ○, a case having a defect rate of 1.00% to 50% is indicated as Δ, and a case having a defect rate of 50% or more is indicated as ×.

TABLE 1

| Samples | Average Thickness of External Electrode te (μm) | G1 (μm) | Reliability Evaluation |
|---|---|---|---|
| *1 | 1.00 | 10 | X |
| *2 | 1.00 | 20 | X |
| *3 | 1.00 | 30 | X |
| *4 | 1.00 | 40 | X |
| *5 | 1.00 | 50 | X |
| *6 | 3.00 | 10 | Δ |
| *7 | 3.00 | 20 | Δ |
| *8 | 3.00 | 30 | Δ |
| *9 | 3.00 | 40 | Δ |
| *10 | 3.00 | 50 | Δ |
| *11 | 5.00 | 10 | Δ |
| *12 | 5.00 | 20 | Δ |
| 13 | 5.00 | 30 | ○ |
| 14 | 5.00 | 40 | ⊚ |
| 15 | 5.00 | 50 | ⊚ |
| *16 | 7.00 | 10 | Δ |
| *17 | 7.00 | 20 | Δ |
| 18 | 7.00 | 30 | ○ |
| 19 | 7.00 | 40 | ⊚ |
| 20 | 7.00 | 50 | ⊚ |

*Comparative Example

Referring to Table 1, in samples 1 to 12, corresponding to comparative examples, in which the average thickness te of the first and second external electrodes formed on the first and second side surfaces of the ceramic body was out of the numerical value range of the inventive example, it may be appreciated that they have reliability problems resulting from a decrease in the accelerated life due to the permeation of the plating solution.

In addition, in samples 16 and 17, corresponding to comparative examples, in which the lengths G1 from the edges of the first or second external electrode formed on the first and second side surfaces of the ceramic body to the points at which the first or second external electrode contacts the first and second leads were out of the numerical value range of the inventive example, it may be appreciated that they have reliability problems.

On the other hand, in samples 13 to 15 and samples 18 to 20, in which the numerical value ranges were all satisfied, it may be appreciated that they have excellent reliability.

The following Table 2 shows reliability comparison results based on the lengths M1 from the corresponding end surface of the ceramic body to the points at which the first or second external electrode contacts the first and second leads.

The reliability evaluation was determined based on whether or not delamination was generated, and more particularly, based on whether or not the delamination was generated by examining a cut surface of the ceramic body. A case having a defect rate less than 0.01% is indicated as ⊚, a case having a defect rate of 0.01% to 1.00% is indicated as ○, a case having a defect rate of 1.00% to 50% is indicated as Δ, and a case having a defect rate of 50% or more is indicated as ×.

TABLE 2

| Samples | M1 (μm) | Reliability Evaluation |
|---|---|---|
| *21 | 20 | X |
| *22 | 25 | X |
| *23 | 30 | X |
| *24 | 35 | Δ |
| *25 | 40 | Δ |
| *26 | 45 | Δ |
| 27 | 50 | ○ |
| 28 | 55 | ○ |
| 29 | 65 | ○ |
| 30 | 70 | ⊚ |
| 31 | 75 | ⊚ |
| 32 | 80 | ⊚ |

*Comparative Example

Referring to Table 2, in samples 21 to 26, corresponding to comparative examples, in which the lengths M1 from the corresponding end surface of the ceramic body to the points at which the first or second external electrode contacts the first and second leads were out of the numerical value range of the inventive example, it may be appreciated that they have reliability problems due to delamination.

On the other hand, in samples 27 to 32, in which the numerical value range was satisfied, it may be appreciated that they have excellent reliability.

Figure 5:
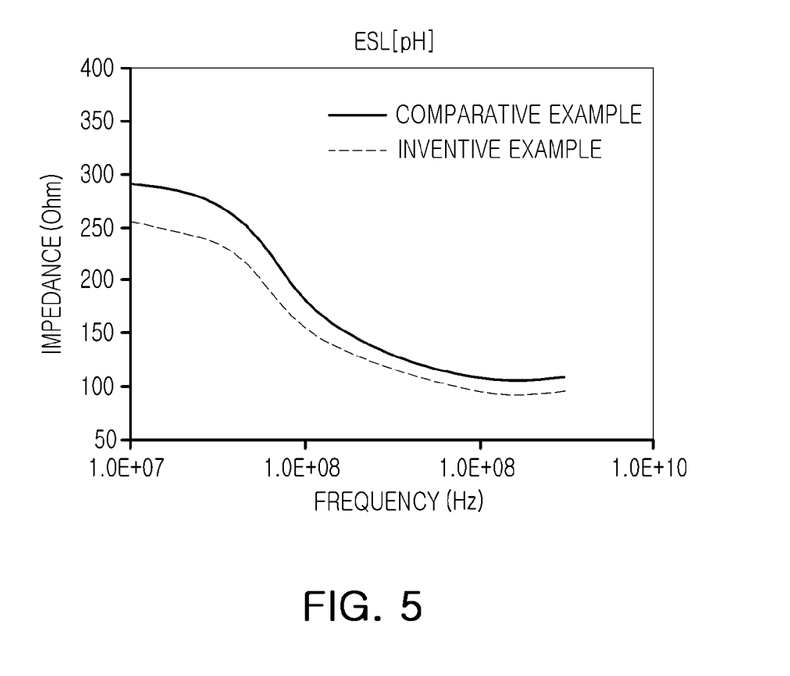
FIG. 5 is a graph illustrating equivalent series inductance (ESL) according to an inventive example and a comparative example.

FIG. 5 is a graph illustrating equivalent series inductance (ESL) according to an inventive example and a comparative example.

Referring to FIG. 5, it may be appreciated that the equivalent series inductance (ESL) according to the inventive example is lower than the equivalent series inductance (ESL) according to the comparative example.

Therefore, in the multilayer ceramic electronic part to be embedded in the board according to the embodiment of the present disclosure, the internal electrodes may be extended to be exposed to the side surfaces of the ceramic body and the vias may be formed to connect the internal electrodes and the external electrodes, whereby the current path may be shortened and the equivalent series inductance (ESL) may be decreased.

As set forth above, in a multilayer ceramic electronic part to be embedded in a board according to exemplary embodiments of the present disclosure, a current path is shortened by extending internal electrodes to be exposed to side surfaces of a ceramic body and forming vias within the ceramic body to connect the internal electrodes to external electrodes, such that equivalent series inductance (ESL) may be decreased.

In addition, the internal electrodes are extended and exposed to only the side surfaces of the ceramic body, such that a decrease in reliability caused by permeation of a plating solution may be prevented.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic part to be embedded in a board, the multilayer ceramic electronic part comprising:
    a ceramic body including dielectric layers and having first and second main surfaces opposing each other, first and second side surfaces opposing each other, and first and second end surfaces opposing each other;
    first and second internal electrodes stacked with each of the dielectric layers interposed therebetween and having first and second leads exposed to the first and second side surfaces of the ceramic body; and
    first and second external electrodes extending from the first and second end surfaces of the ceramic body to portions of the first and second main surfaces and the first and second side surfaces thereof,
    wherein when lengths from edges of the first or second external electrode formed on the first and second side surfaces of the ceramic body to points at which the first or second external electrode contacts the first and second leads are G1, lengths from the edges of the first or second external electrode formed on the first and second side surfaces of the ceramic body to a corresponding end surface of the ceramic body are BW1, and lengths from the corresponding end surface of the ceramic body to points at which the first or second external electrode contacts the first and second leads are M1, $30\ \mu m \leq G1 < BW1-M1$ is satisfied,
    the first internal electrodes are connected to the first external electrode by at least one first via extending to at least one of the first and second main surfaces of the ceramic body, and
    the second internal electrodes are connected to the second external electrode by at least one second via extending to at least one of the first and second main surfaces of the ceramic body.

2. The multilayer ceramic electronic part of claim 1, wherein the lengths M1 from the corresponding end surface of the ceramic body to the points at which the first or second external electrode contacts the first and second leads satisfy $50\ \mu m \leq M1 < BW1-G1$.

3. The multilayer ceramic electronic part of claim 1, wherein when lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, $30\ \mu m \leq G2 < BW2-M2$ is satisfied.

4. The multilayer ceramic electronic part of claim 1, wherein when lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, $50\ \mu m \leq M2 < BW2-G2$ is satisfied.

5. The multilayer ceramic electronic part of claim 1, wherein the first and second external electrodes formed on the first and second side surfaces of the ceramic body have an average thickness of 5 μm or more.

6. The multilayer ceramic electronic part of claim 1, wherein the first and second external electrodes have a metal layer formed thereon, the metal layer being formed of copper (Cu).

7. A multilayer ceramic electronic part to be embedded in a board, the multilayer ceramic electronic part comprising:
    a ceramic body including dielectric layers and having first and second main surfaces opposing each other, first and second side surfaces opposing each other, and first and second end surfaces opposing each other;
    first and second internal electrodes stacked with each of the dielectric layers interposed therebetween and having first and second leads exposed to at least one of the first and second side surfaces of the ceramic body; and
    first and second external electrodes extending from the first and second end surfaces of the ceramic body to portions of the first and second main surfaces and the first and second side surfaces thereof,
    wherein when lengths from edges of the first or second external electrode formed on the first and second side surfaces of the ceramic body to points at which the first or second external electrode contacts the first and second leads are G1, lengths from the edges of the first or second external electrode formed on the first and second side surfaces of the ceramic body to a corresponding end surface of the ceramic body are BW1, and lengths from the corresponding end surface of the ceramic body to points at which the first or second external electrode contacts the first and second leads are M1, $50\ \mu m \leq M1 < BW1-G1$ is satisfied,
    the first internal electrodes are connected to the first external electrode by at least one first via extending to at least one of the first and second main surfaces of the ceramic body, and the second internal electrodes are connected to the second external electrode by at least one second via extending to at least one of the first and second main surfaces of the ceramic body.

8. The multilayer ceramic electronic part of claim 7, wherein when lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 30 µm≤G2<BW2−M2 is satisfied.

9. The multilayer ceramic electronic part of claim 7, wherein when lengths from edges of the first or second external electrode formed on the first and second main surfaces of the ceramic body to points at which the first or second external electrode contacts the first and second vias are G2, lengths from the edges of the first or second external electrode formed on the first and second main surfaces of the ceramic body to a corresponding end surface of the ceramic body are BW2, and lengths from the corresponding end surface of the ceramic body to points at which the first or second external electrode contacts the first and second vias are M2, 50 µm≤M2<BW2−G2 is satisfied.

10. The multilayer ceramic electronic part of claim 7, wherein the first and second external electrodes formed on the first and second side surfaces of the ceramic body have an average thickness of 5 µm or more.

11. The multilayer ceramic electronic part of claim 7, wherein the first and second external electrodes have a metal layer formed thereon, the metal layer being formed of copper (Cu).

12. A printed circuit board having a multilayer ceramic electronic part embedded therein, the printed circuit board comprising:
   an insulating substrate; and
   the multilayer ceramic electronic part of claim 1 embedded in the insulating substrate.

13. A printed circuit board having a multilayer ceramic electronic part embedded therein, the printed circuit board comprising:
   an insulating substrate; and
   the multilayer ceramic electronic part of claim 2 embedded in the insulating substrate.

14. A printed circuit board having a multilayer ceramic electronic part embedded therein, the printed circuit board comprising:
   an insulating substrate; and
   the multilayer ceramic electronic part of claim 3 embedded in the insulating substrate.

15. A printed circuit board having a multilayer ceramic electronic part embedded therein, the printed circuit board comprising:
   an insulating substrate; and
   the multilayer ceramic electronic part of claim 4 embedded in the insulating substrate.

16. A printed circuit board having a multilayer ceramic electronic part embedded therein, the printed circuit board comprising:
   an insulating substrate; and
   the multilayer ceramic electronic part of claim 5 embedded in the insulating substrate.

17. A printed circuit board having a multilayer ceramic electronic part embedded therein, the printed circuit board comprising:
   an insulating substrate; and
   the multilayer ceramic electronic part of claim 6 embedded in the insulating substrate.

18. A printed circuit board having a multilayer ceramic electronic part embedded therein, the printed circuit board comprising:
   an insulating substrate; and
   the multilayer ceramic electronic part of claim 7 embedded in the insulating substrate.

* * * * *